United States Patent
Cook et al.

(10) Patent No.: US 7,771,643 B1
(45) Date of Patent: Aug. 10, 2010

(54) METHODS OF MAKING AN UNSUPPORTED ARTICLE OF SEMICONDUCTING MATERIAL BY CONTROLLED UNDERCOOLING

(75) Inventors: Glen Bennett Cook, Elmira, NY (US); Prantik Mazumder, Ithaca, NY (US); Balram Suman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 61 days.

(21) Appl. No.: 12/394,608

(22) Filed: Feb. 27, 2009

(51) Int. Cl.
*B28B 1/38* (2006.01)
*C30B 19/00* (2006.01)

(52) U.S. Cl. ............................ 264/305; 177/60; 177/53

(58) Field of Classification Search ................ 264/305; 117/53, 64, 60, 934
See application file for complete search history.

(56) References Cited

U.S. PATENT DOCUMENTS

| | | | |
|---|---|---|---|
| 4,112,135 A | 9/1978 | Heaps et al. | |
| 4,128,680 A | 12/1978 | Heaps et al. | |
| 4,137,355 A | 1/1979 | Heaps et al. | |
| 4,243,472 A | 1/1981 | O'Neill | |
| 4,251,570 A | 2/1981 | Zook | |
| 4,447,289 A | 5/1984 | Geissler et al. | |
| 4,778,478 A | 10/1988 | Barnett | |
| 5,712,199 A | 1/1998 | Nakagawa et al. | |
| 6,231,667 B1 | 5/2001 | Iwane et al. | |
| 6,596,075 B2 | 7/2003 | Igarashi et al. | |
| 6,682,990 B1 | 1/2004 | Iwane et al. | |
| 6,802,900 B2 | 10/2004 | Iwane et al. | |
| 6,946,029 B2 | 9/2005 | Tsukuda et al. | |
| 7,071,489 B2 | 7/2006 | Tsukuda | |
| 7,186,578 B2 | 3/2007 | Goma et al. | |

FOREIGN PATENT DOCUMENTS

| | | |
|---|---|---|
| WO | 2005104244 A1 | 11/2005 |
| WO | 2009002550 A1 | 12/2008 |

OTHER PUBLICATIONS

R.O. Bell et al.; "Growth of Silicon Sheets for Photovoltaic Applications"; Journal of Materials Research, vol. 13, No. 10, Oct. 1998; pp. 2732-2739.
D. Turnbull; "Formation of Crystal Nuclei in Liquid Metals"; Journal of Applied Physics; vol. 21, 1950; pp. 1022-1028.
J.G. Li et al.; "Wetting and Adhesion in Liquid Silicon/Ceramic Systems"; Materials Letters vol. 14 (1992) pp. 329-332.
D. Turnbull; "Kinetics of Heterogeneous Nucleation"; Journal of Chemical Physics, vol. 18, No. 2; Feb. 1950; pp. 198-203.
D. Turnbull et al.; "Rate of Nucleation in Condensed Systems"; The Journal of Chemical Physics, vol. 17, No. 1; Jan. 1949; pp. 71-73.

*Primary Examiner*—Joseph S Del Sole
*Assistant Examiner*—Jeremiah Smith
(74) *Attorney, Agent, or Firm*—Michael W. Russell; O'Brien Jones PLLC (57) ABSTRACT

The invention relates to methods of making articles of semiconducting material and semiconducting material articles formed thereby, such as semiconducting material that may be useful in making photovoltaic cells.

23 Claims, 5 Drawing Sheets

METHODS OF MAKING AN UNSUPPORTED ARTICLE OF SEMICONDUCTING MATERIAL BY CONTROLLED UNDERCOOLING

FIELD

The invention relates generally to methods of making articles of unsupported semiconducting materials by controlled undercooling.

BACKGROUND

Semiconducting materials find uses in many applications. For example, semiconducting materials can be used in electronic devices as processors formed on semiconductor wafers. As a further example, semiconducting materials can be used to convert solar radiation into electrical energy through the photovoltaic effect.

The semiconducting properties of a semiconducting material may depend on the crystal structure of the material. Notably, faults within the crystal structure of a semiconducting material may diminish the material's semiconducting properties.

The grain size and shape distribution often play an important part in the performance of semiconducting devices where a larger and more uniform grain size is often desirable. For example, the electrical conductivity and efficiency of photovoltaic cells may be improved by increasing grain size and the uniformity of grains.

For silicon-based solar photovoltaic cells, the silicon can, for example, be formed as an unsupported sheet, or can be supported by forming the silicon on a substrate. Conventional methods for making unsupported and supported articles of semiconducting materials, such as silicon sheets, have several shortcomings. Methods of making unsupported, i.e., without an integral substrate, thin semiconducting material sheets may be slow or wasteful of the semiconducting material feedstock.

Methods by which unsupported single crystalline semiconducting materials are made include, for example, the Czochralski process, which may lead to significant kerf loss when the semiconducting material is sliced or cut into a thin sheets or wafers. Methods by which unsupported multicrystalline semiconducting materials are made include, for example, electromagnetic casting and ribbon growth techniques, which may be slow, producing about 1-2 cm/min for polycrystalline silicon ribbon growth technologies.

Other useful methods for producing unsupported multicrystalline semiconducting material are disclosed in U.S. Provisional Patent Application No. 61/067,679, filed Feb. 29, 2008, titled "METHOD OF MAKING AN UNSUPPORTED ARTICLE OF A PURE OR DOPED SEMICONDUCTING ELEMENT OR ALLOY," the disclosure of which is hereby incorporated by reference.

Supported semiconducting material sheets may be made less expensively, but the thin semiconducting material sheet is limited to the substrate on which it is made, and the substrate has to meet various process and application requirements, which may be conflicting.

Thus, there is a long-felt need in the industry for a method to make unsupported articles of semiconducting materials, which method may improve crystal grain structure of the article of semiconducting material, reduce material waste, and/or increase the rate of production.

SUMMARY

In accordance with various exemplary embodiments of the invention are provided methods of making an unsupported article of semiconducting material comprising providing a mold at a temperature $T_0$, providing a molten semiconducting material at a bulk temperature $T_{Melt}$, wherein $T_{Melt} \geq T_0$, immersing the mold in the molten semiconducting material at least once for a first period of time sufficient to form a solid layer of the semiconducting material over an external surface of the mold and for the formed solid layer of semiconducting material to completely remelt, withdrawing the mold from the molten semiconducting material, holding the mold above the molten semiconducting material for a period of time sufficient to undercool the mold a predetermined amount, immersing the mold in the molten semiconducting material for a second period of time sufficient to form a solid layer of the semiconducting material over the external surface of the mold, withdrawing the mold with the solid layer of semiconducting material over the external surface of the mold, and separating the solid layer of semiconducting material from the mold to form the unsupported article of the semiconducting material.

Other exemplary embodiments relate to methods of making an article of semiconducting material comprising providing a mold at a temperature $T_0$, wherein the mold comprises a surface comprising a primary material and at least one secondary material at discrete locations, the secondary material having a contact angle with a molten semiconducting material that is less than the contact angle between the primary material and the molten semiconducting material, providing the molten semiconducting material at a bulk temperature $T_{Melt}$, wherein $T_{Melt} \geq T_0$, immersing the mold in the molten semiconducting material at least once for a first period of time sufficient to form a solid layer of the semiconducting material over the surface of the mold and for the formed solid layer of semiconducting material to completely remelt, withdrawing the mold from the molten semiconducting material, holding the mold above the molten semiconducting material for a period of time sufficient to undercool the mold a predetermined amount, immersing the mold in the molten semiconducting material for a second period of time sufficient to form a solid layer of the semiconducting material over the surface of the mold, withdrawing the mold with the solid layer of semiconducting material over the external surface of the mold, and separating the solid layer of semiconducting material from the mold to form the unsupported article of the semiconducting material.

Exemplary embodiments of the invention also relate to articles of semiconducting material formed by a method comprising providing a mold at a temperature $T_0$, providing a molten semiconducting material at a bulk temperature $T_{Melt}$, wherein $T_{Melt} \geq T_0$, immersing the mold in the molten semiconducting material for a first period of time sufficient to form a solid layer of the semiconducting material over an external surface of the mold and for the formed solid layer of semiconducting material to completely remelt, withdrawing the mold from the molten semiconducting material, holding the mold above the molten semiconducting material for a period of time sufficient to undercool the mold a predetermined amount, immersing the mold in the molten semiconducting material for a second period of time sufficient to form a solid layer of the semiconducting material over the external surface of the mold, withdrawing the mold with the solid layer of semiconducting material over the external surface of the mold, and separating the solid layer of semiconducting material from the mold to form the unsupported article of the semiconducting material.

The methods according to the present invention may, in at least some embodiments, improve the crystal grain structure of semiconducting materials, reduce material waste, and/or increase the rate of production of articles of the semiconducting material.

As used herein, the term "semiconducting material" includes materials that exhibit semiconducting properties, such as, for example, silicon, germanium, tin, gallium arsenide, as well as alloys, compounds, and mixtures thereof. In various embodiments, the semiconducting material may be pure (such as, for example, intrinsic or i-type silicon) or doped (such as, for example, silicon containing a n-type or p-type dopant, such as phosphorous or boron, respectively).

As used herein, the phrase "article of semiconducting material" includes any shape or form of semiconducting material made using the methods of the present invention. Examples of such articles include articles that are smooth or textured; articles that are flat, curved, bent, or angled; and articles that are symmetric or asymmetric. Articles of semiconducting materials may comprise forms such as, for example, sheets or tubes.

As used herein, the term "unsupported" means that an article of semiconducting material is not integral with a mold. The unsupported article may be loosely connected to the mold while it is being formed, but the article of semiconducting material is separated from the mold after it is formed over the mold. The unsupported article may, however, be subsequently applied on a substrate for various applications, such as photovoltaic applications.

As used herein, the term "mold" means a physical structure that can influence the final shape of the article of semiconducting material. Molten or solidified semiconducting material need not actually physically contact a surface of the mold in the methods described herein, although contact may occur between a surface of the mold and the molten or solidified semiconducting material.

As used herein, the term "external surface of the mold" means a surface of the mold that may be exposed to a molten semiconducting material upon immersion. For example, the interior surface of a tube-shaped mold may be an external surface if the internal surface can contact a molten semiconducting material when the mold is immersed.

As used herein, the phrase "form a solid layer of semiconducting material over an external surface of the mold" and variations thereof mean that semiconducting material from the molten semiconducting material solidifies (also referred to herein as freezing or crystallizing) on or near an external surface of the mold. Forming a solid layer of semiconducting material over an external surface of the mold may, in some embodiments, include solidifying semiconducting material on a layer of particles that coat the external surface of the mold. In various embodiments, due to the temperature difference between the mold and the molten semiconducting material, the semiconducting material may solidify before it physically contacts the surface of the mold. When the semiconducting material solidifies before it physically contacts the mold, the solidified semiconducting material may, in some embodiments, subsequently come into physical contact with the mold or with particles coating the mold. The semiconducting material may, in some embodiments, also solidify after physically contacting the external surface of the mold, or particles coating the surface of the mold, if present.

As used herein, the phrase "templated mold" means a mold having a surface comprising a primary material and discrete locations of at least one secondary material exposed to the molten semiconducting material. The primary material and at least one secondary material may have different contact angles with the molten semiconducting material and thus, different nucleation properties with the molten semiconducting material. For example, a templated mold may comprise a primary material having a high contact angle with the molten semiconducting material and at least one secondary material having a lower contact angle with the molten semiconducting material. The templated mold according to the invention may have any arrangement of at least one secondary material on the surface of the mold, such as, for example, various patterns of dots comprising the at least one secondary material on a surface of the primary material.

As used herein, the phrase "increased rate of production" and variations thereof includes any increase in the rate of semiconducting material article production with respect to conventional methods for producing semiconducting material, such as ribbon growth methods. For example, an increased rate of production may be any rate greater than about 1-2 cm/min.

As used herein, the phrase "reduced material waste" and variations thereof means any reduction in the amount of semiconducting material lost through conventional methods using slicing or cutting following production of the article of semiconducting material.

As used herein, the term "crystalline" means any material comprising a crystal structure, including, for example, single crystalline and multicrystalline materials.

As used herein, the term "multicrystalline" includes any material comprised of a plurality of crystal grains. For example, multicrystalline materials may include polycrystalline, microcrystalline, and nanocrystalline materials.

As used herein, the term "crystal grain structure" includes grain size, grain shape, uniformity of grain size, uniformity of grain shape, and/or uniformity of grain direction. An improvement in the crystal grain structure may include, for example, an increase in grain size or uniformity of grain size and/or shape, and/or may reduce the amount of post-processing the article of semiconducting material may undergo as compared to conventional methods for producing semiconducting material.

As used herein, the term "undercooling" refers to a process in which a temperature difference is generated between the molten semiconducting material and the mold that may cause solidification (also referred to herein as freezing) of the molten semiconducting material, and the amount of undercooling may be measured in degrees Kelvin (K) or Celsius (° C.). The term "controlled undercooling" means the amount of undercooling is a set or predetermined amount that may be controlled by the methods of the invention.

As used herein, the term "nucleation rate" means the rate at which new crystal seeds form and may be measured in number of seeds per unit area.

As used herein, the term "equiaxed growth" means the formation of many small grains with random orientations. Equiaxed growth may occur, for example, at the beginning of the crystallization process, such as when a mold is initially immersed in molten semiconducting material. Equiaxed growth may occur in a generally planar direction with respect to the surface of a mold.

As used herein, the term "columnar growth" means the growth of crystals in a direction normal to the surface of a mold such that a crystal dimension parallel to the growth direction is greater than a crystal dimension perpendicular to the growth direction.

As used herein, the terms, "temperature of the molten semiconducting material," "bulk temperature of the molten semiconducting material," and variations thereof mean the average temperature of the molten semiconducting material contained within a suitable vessel. Localized temperatures within the molten semiconducting material may vary at any point in time, such as, for example, areas of the molten semiconducting material proximate to the mold when the mold is immersed, or molten semiconducting material exposed to atmospheric conditions at the top surface of the vessel. In various embodiments, the average temperature of the molten semiconducting material is substantially uniform despite any localized temperature variation.

As described herein, the invention relates to methods of making articles of semiconducting material and semiconducting material articles formed thereby. In the following description, certain aspects and embodiments will become evident. It should be understood that the invention, in its broadest sense, could be practiced without having one or more features of these aspects and embodiments. It should be understood that these aspects and embodiments are merely exemplary and explanatory, and are not restrictive of the invention as claimed.

BRIEF DESCRIPTION OF DRAWINGS

The following figures, which are described below and which are incorporated in and constitute a part of the specification, illustrate exemplary embodiments of the invention and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

DETAILED DESCRIPTION

It is to be understood that both the foregoing general description and the following detailed description are exemplary and explanatory only, and are not restrictive of the invention, as claimed. Other embodiments of the invention will be apparent to those skilled in the art from consideration of the specification and practice of the invention disclosed herein. It is intended that the specification be considered as exemplary only.

Figure 1:
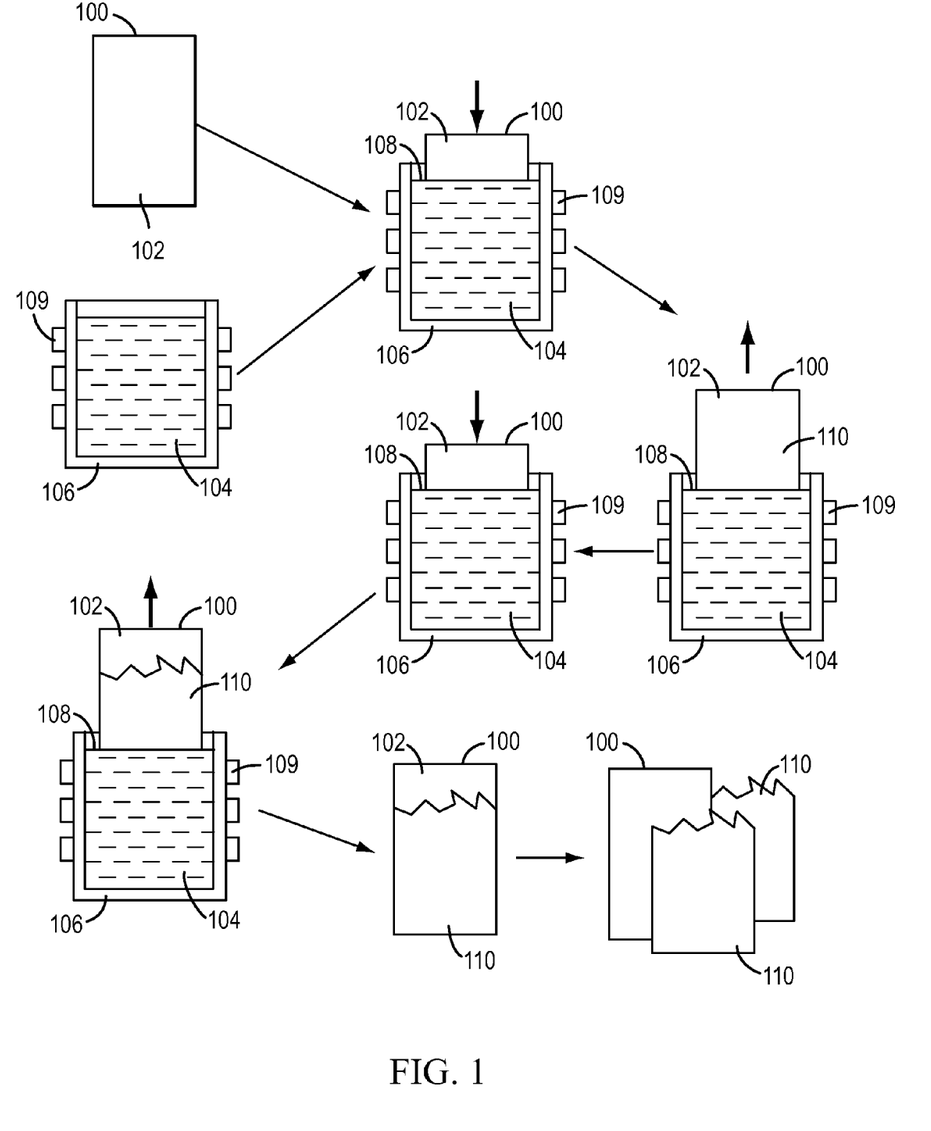
FIG. 1 is a schematic illustration of an exemplary method of making an unsupported article of semiconducting material according to an embodiment of the invention.

FIG. 1 illustrates an exemplary method of making an unsupported article of a semiconducting material according to at least one embodiment of the invention. The exemplary method is an exocasting process, which casts the article over an exterior surface of a mold, rather than within an internal mold cavity. A mold 100 is provided having an external surface 102 with a desired size (surface area), shape, and surface texture/pattern. The surface area, shape, and surface texture/pattern of the external surface 102 of the mold 100 may determine the size, shape, and surface texture/pattern of the cast article. One of ordinary skill in the art would recognize that the size, shape, and surface texture/pattern of the external surface 102 of the mold 100 can be selected based on, for example, the desired properties and features of the cast article.

Molten semiconducting material 104 such as, for example, silicon, may be provided by melting silicon in a vessel 106, such as a crucible, which may optionally be non-reactive with the silicon. In at least one embodiment, molten semiconducting material 104 may have low contaminant levels. For example, molten semiconducting material 104 may comprise less than about 1 ppm of iron, manganese, and chromium, and less than about 1 ppb of vanadium, titanium, and zirconium. Molten semiconducting material 104 may also comprise less than about $10^{15}$ atoms/cm$^3$ of nitrogen and/or $10^{17}$ atoms/cm$^3$ of carbon. In at least one embodiment, the source of the semiconducting material may be photovoltaic-grade silicon or purer silicon.

In one exemplary embodiment, the molten semiconducting material 104 may be brought to a bulk temperature, $T_{Melt}$, in a low oxygen or reducing atmosphere using any suitable heating device or method. The bulk temperature of the molten semiconducting material, $T_{Melt}$, may also be maintained at that temperature by any suitable heating device or method. Suitable heating devices and methods include heating elements, such as resistive or inductive heating elements, and a flame heat source. One skilled in the art would recognize that the choice of a heat source may be made based on several factors such as, for example, the capacity of the vessel containing the molten semiconducting material, the size/thickness of the vessel, and/or the atmosphere surrounding the vessel.

In at least one embodiment, the bulk temperature of molten semiconducting material, $T_{Melt}$, may be the melting temperature of the semiconducting material, or may be a higher temperature. In one exemplary embodiment where the semiconducting material comprises silicon, the bulk temperature of the molten silicon may range from about 1414° C. to about 1550° C., such as, for example, from about 1450° C. to about 1490° C.

In at least one embodiment of the invention, mold 100 at a starting temperature, $T_0$ (i.e., $T_{Mold}$ at time, t=0), may be provided in a low oxygen or reducing atmosphere. The starting temperature of mold, $T_0$, may in at least some embodiments be chosen so that $T_0 \leq T_{Melt}$. According to at least one embodiment of the invention, mold 100 is not pre-heated prior to immersing mold 100 in molten semiconducting material 104. In at least one embodiment of the invention, the temperature of mold 100 is altered only by the molten semiconducting material 104 and by the atmosphere outside of vessel 106, i.e., the temperature of mold 100 is not directly regulated by any heating or cooling devices.

According to at least one embodiment, the mold 100 may be immersed in the molten semiconducting material at least two times. According to at least one embodiment, the mold 100 is immersed at least once for a time sufficient such that mold 100 may reduce the temperature of the molten material in close proximity to the external surface of mold 100 to the freezing point of the semiconducting material 104 and to remove sufficient heat from the molten semiconducting material 104 to freeze at least a portion of the semiconducting material. The mold 100 may remain immersed in the molten semiconducting material 104 for a time sufficient for the frozen semiconducting material to remelt and the mold 100 to reach a temperature such that the temperature of the mold, $T_{Mold}$, may equilibrate with the temperature of the molten semiconducting material, $T_{Melt}$ (i.e., $T_{Mold}=T_{Melt}$). The immersion of mold 100 may optionally be repeated additional times to thermally equilibrate mold 100 with the molten semiconducting material 104.

The amount of time sufficient for the semiconducting material to freeze/solidify and remelt is within the ability of those skilled in the art to determine based on variables such as, for example, the semiconducting material, the material comprising the mold, the amount of undercooling, and the thickness of the mold. For example, for a mold having a thickness of about 2 mm, the amount of time over which freezing takes place may be up to about 5 seconds, such as, for example, about 3 seconds. For example, for a mold having a thickness of about 2 mm, the amount of time over which remelting takes place may be up to about 60 seconds, such as, for example, about 40 seconds.

Figure 2:
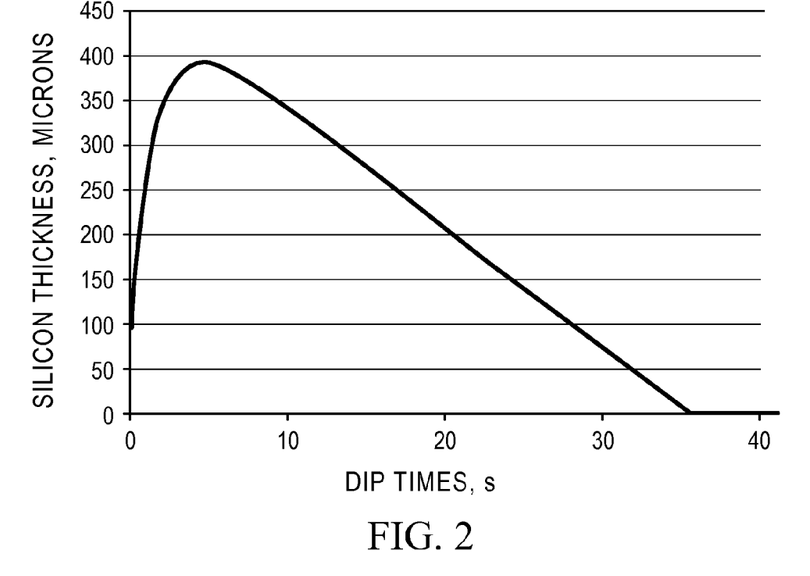
FIG. 2 is a representative calculated plot of the thickness of a silicon article formed as a function of the immersion time in molten silicon.

A representative calculated plot of the thickness of a silicon article formed as a function of the immersion time in molten silicon during the freezing-remelting process is shown in FIG. 2. As seen in FIG. 2, the thickness of the solidified layer rapidly increases and then slowly decreases to zero. The instantaneous velocity of the growth of the solid-liquid interface perpendicular to the surface of mold 100 can be calculated using the Stefan condition (Equation 1)

$$K_S \frac{\partial T}{\partial x}\bigg|_S - K_L \frac{\partial T}{\partial x}\bigg|_L = v_i \rho_s \lambda \qquad \text{Eq. 1}$$

where $K_S$ and $K_L$ are the thermal conductivities of the solid and liquid phases, respectively, $v_i$ is the instantaneous interface velocity, $\rho_S$ is the density of the solid, T is the temperature, x is the position normal to the solid-liquid interface, $\lambda$ the latent heat of fusion, and S and L denote solid and liquid phases, respectively. The first and second terms on the left side of Equation 1 are the heat fluxes through the solid and the liquid phases, respectively. If the heat flux through the solid is larger than the heat flux thorough the liquid, then the interface velocity is positive and freezing continues. Conversely, if the heat flux through the liquid is higher than the heat flux thorough the solid, the interface velocity is negative and remelting takes place.

When the mold is initially immersed in the molten semiconductor material, i.e., during the freezing phase, the heat flux through the solid phase may be much larger than that through the initially isothermal liquid, and therefore rapid solidification into the liquid takes place. The solidification continues until the heat fluxes through the liquid and the solid become equal. Beyond this point, the heat flux through the liquid is higher than that through the solid and remelting starts. During the remelting phase, latent heat is supplied to the interface from the liquid melt. Therefore, during this phase, the liquid side thermal properties control the remelting dynamics. The remelting process may continue until the initially frozen solid is completely melted and the mold thermally equilibrates with the molten semiconducting material.

The amount of time it takes for the frozen semiconducting material to remelt may be approximately determined by Equations 2 and 3

$$t_{remelt} = \frac{d_{Mold}^2}{8\alpha_{Mold}} \ln(1-f) + \Delta^2 \pi \alpha_{Melt} \left(\frac{\rho_{Melt}\lambda}{2K_{Melt}(T_M - T_{Melt})}\right)^2 \qquad \text{Eq. 2}$$

$$\Delta = \frac{1}{2}\left[\frac{\rho_{Mold}Cp_{Mold}d_{Mold}(T_M - T_0)}{\rho_{Melt}\lambda + \rho_{Melt}Cp_{Melt}(T_{Melt} - T_M)}\right] \qquad \text{Eq. 3}$$

where $t_{remelt}$ is the complete remelting time, $d_{Mold}$ is the mold thickness, $\alpha_{Mold}$ is the thermal diffusivity of the mold, $\rho_{Mold}$ is the density of the mold, $Cp_{Mold}$ is the heat capacity of the mold, and $\Delta$ is the maximum thickness of semiconducting material formed on the surface of the mold. The quantities $\alpha_{Melt}$ and $Cp_{Melt}$ are the thermal diffusivity and heat capacity of the molten semiconducting material, respectively. The density and thermal conductivity of the molten semiconducting material are $\rho_{Melt}$ and $K_{Melt}$, respectively, and $\lambda$ is the latent heat. $T_M$ is the melting temperature of the semiconducting material, $T_0$ is the initial temperature of the mold, and $T_{Melt}$ is the bulk temperature of the molten semiconducting material. The expression for the mold temperature increase is exponential. Thus, a quantity, f, wherein 0<f<1, is introduced to yield an approximate time at which the temperature of the mold, $T_{Mold}$, is sufficiently equal to the temperature of the molten semiconducting material, $T_{Melt}$. In at least one embodiment, the remelting time, $t_{remelt}$, may be calculated using a value of f equal to 0.9.

Once the frozen layer of semiconducting material has substantially remelted and the temperature of the mold, $T_{Mold}$, reaches approximately the temperature of the molten semiconducting material, $T_{Melt}$, mold 100 may be removed from the molten semiconducting material 104 and allowed to cool. The amount of time sufficient for the mold to substantially thermally equilibrate with the molten semiconducting material is within the ability of those skilled in the art to determine and may be based on variables such as, for example, the material comprising the mold, the semiconducting material, the thickness of the mold, and the amount of undercooling. For example, a 2 mm thick fused silica mold may thermally equilibrate with the molten semiconducting material in about 50 seconds.

The mold 100 may cool by radiation and/or convection after it is removed from the molten semiconducting material. At high temperatures, radiation may dominate the cooling process and the temperature of mold 100 may be approximated by Equation 4

$$\frac{1}{T_{Mold}^3} = \frac{1}{T_{Melt}^3} + \frac{6\varepsilon_{Mold}\sigma}{d_{Mold}\rho_{Mold}Cp_{Mold}}t \qquad \text{Eq. 4}$$

where $T_{Mold}$ is the temperature of the mold at time t, $T_{Melt}$ is the temperature of the mold at the time immediately prior to removal from the molten semiconducting material (i.e., the temperature of the melt), $\varepsilon_{Mold}$ is the emissivity of the mold, $\sigma$ is the Stefan-Boltzmann constant, $\rho_{Mold}$ is the density of the mold, $Cp_{Mold}$ is the heat capacity of the mold, $d_{Mold}$ is the thickness of the mold, and t is time.

Figure 3:
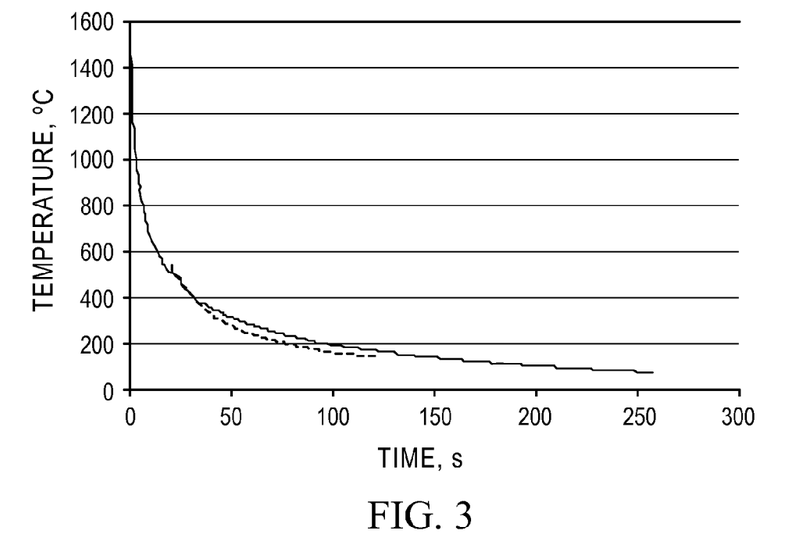
FIG. 3 is a graph illustrating the calculated and measured temperature of a mold as a function of time after removing the mold from a bath of molten semiconducting material.
Figure 4:
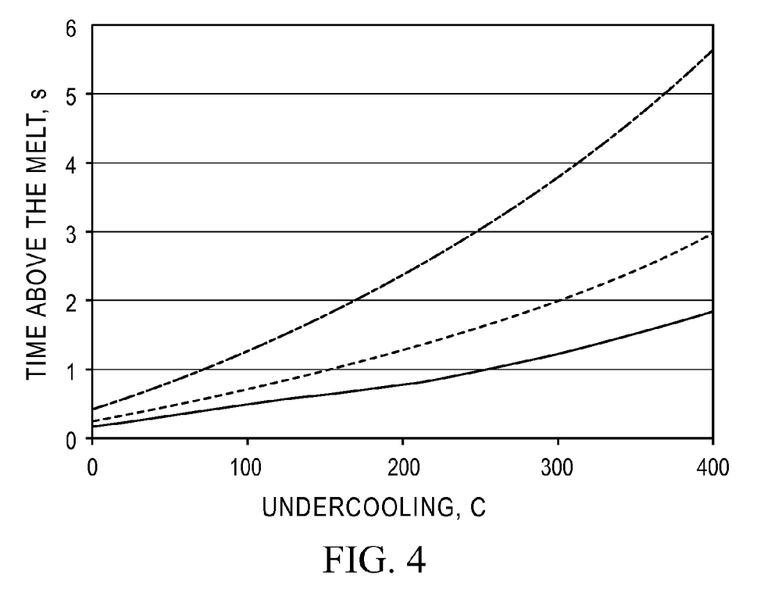
FIG. 4 is a graph illustrating the time needed to cool a mold while holding it above the melt after removing it from the melt as a function of the desired undercooling of the mold at different levels of surface thickness.

A plot of the temperature of an exemplary mold 100 as a function of time after removing the mold 100 from the molten semiconducting material 104 is shown in FIG. 3. FIG. 3 compares the calculated temperature $T_{Mold}$ (solid line) and actual experimental measurements (dotted line) according to an embodiment of the invention. A graph of the cooling time after the mold 100 is removed from the molten semiconducting material 104 as a function of the amount of desired undercooling (i.e., $T_{Melt}-T_{Mold}$=amount of undercooling) is shown in FIG. 4. In FIG. 4, the solid line represents a mold having a thickness of 1 mm, the dotted line represents a mold having a thickness of 1.6 mm, and the line of dashes and dots represents a mold having a thickness of 3 mm. As seen in FIG. 4, thicker molds may take a greater amount of time to reach the same amount of undercooling as thinner molds.

Figure 7:
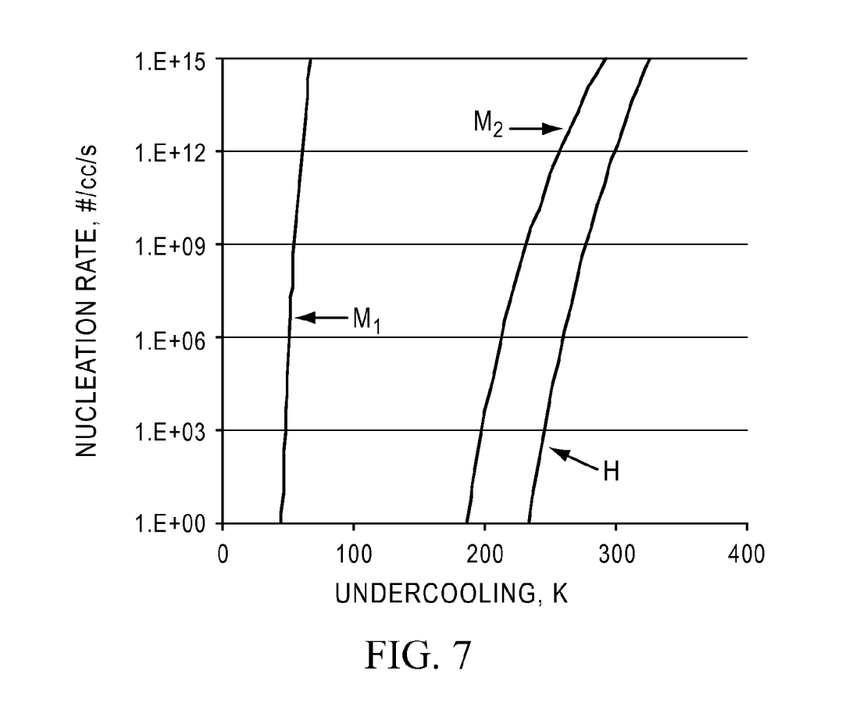
FIG. 7 is a graph illustrating calculated nucleation rates of silicon homogeneous nucleation, heterogeneous nucleation on fused silica, and heterogeneous nucleation on silicon carbide as a function of undercooling.

In at least one embodiment, mold 100 may be immersed in the molten semiconducting material 104 a second time after a set or predetermined amount of undercooling has been reached. For example, a 2 mm fused silica mold undercooled by 400 K may be immersed for about 1 sec to about 4 sec, such as from about 1 sec to about 3 sec. Without wishing to be bound by theory, it is believed that reducing the amount of undercooling decreases the nucleation rate on the mold. A graph of the nucleation rate as a function of the amount of undercooling is shown in FIG. 7 for molds made of silicon carbide ($M_1$) and fused silica ($M_2$), as well as for homogeneous nucleation (H). It is believed that reducing the nucleation rate may improve the crystal grain structure of solidified semiconducting material.

Initial crystal growth may extend substantially planar to the surface of the mold 100 until the surface of the mold 100 is substantially covered and the individual grains impinge on one another. Limiting the nucleation rate may reduce the number of grains formed and may thus improve the crystal grain structure of the semiconducting material. Once the surface of the mold 100 has been substantially covered with solidified semiconducting material, growth occurs mainly normal to the surface of the mold 100, and/or parallel to the direction of heat flow. Reducing the amount of undercooling, however, may limit the maximum possible thickness of the semiconducting material. The maximum thickness, $\Delta$, of the semiconducting material formed on the surface of mold 100 may be estimated using Equation 3, above.

Figure 5:
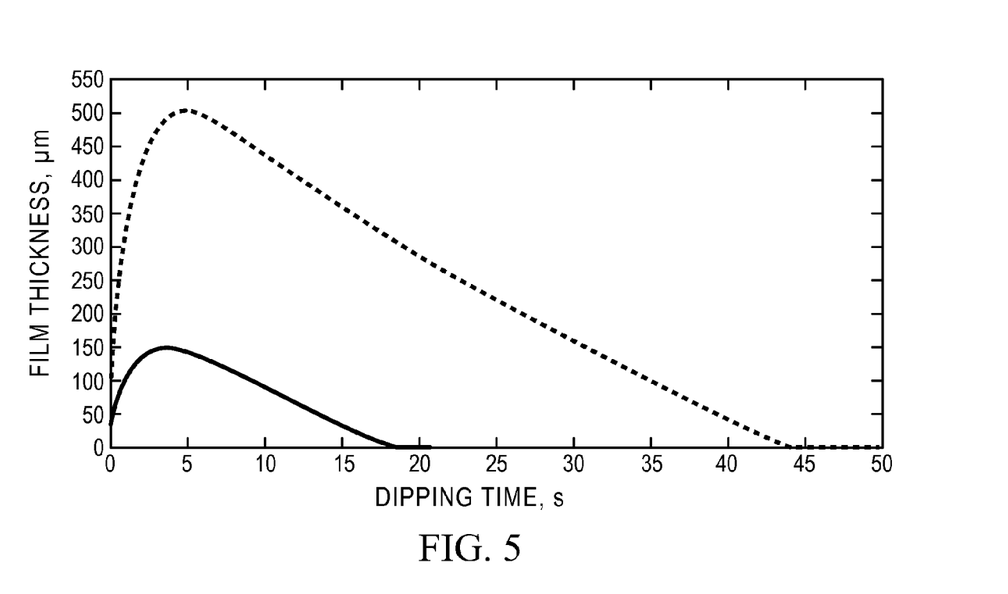
FIG. 5 is a graph illustrating the calculated thickness of a silicon article as a function of the immersion time at different levels of undercooling and different levels of substrate thickness.

A graph comparing the thicknesses of articles of semiconducting materials made according to an embodiment of the invention by a mold undercooled by 1000° C., represented by the dashed line, and a mold undercooled by 400° C., represented by the solid line, as a function of time is shown in FIG. 5. In at least one embodiment, the predetermined amount of undercooling may be chosen based on the desired thickness and/or grain structure of the produced article of semiconducting material.

Figure 8:
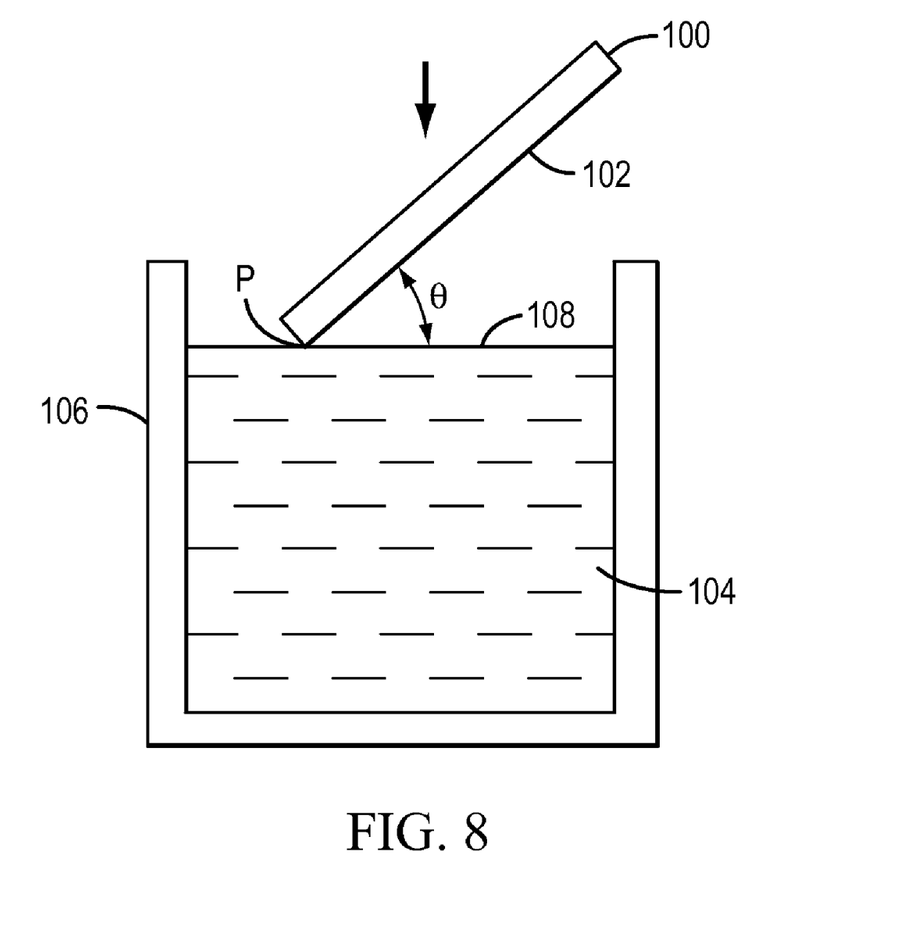
FIG. 8 is a schematic representation of an exemplary immersion angle of a mold as it is immersed in molten semiconducting material.

According to at least one embodiment, as shown in FIGS. 1 and 8, mold 100 may be immersed in the molten semiconducting material 104 at a set or predetermined rate, optionally in a low oxygen or reducing atmosphere. Mold 100 may be immersed in molten semiconducting material 104 at any immersion angle θ, where immersion angle θ is the angle between the surface 108 of molten semiconducting material 104 and the external surface 102 of mold 100 at the point P that first contacts the surface 108 of molten semiconducting material 104 as shown in FIG. 8. The angle at which external surface 102 of mold 100 contacts molten semiconducting material 104 may vary as mold 100 is immersed in molten semiconducting material 104. By way of example only, in one embodiment, molten semiconducting material could contact a mold having a spherical external surface at an infinite number of angles as it is immersed, although the immersion angle θ would be 0° as the initial contact point would be parallel to the surface 108 of molten semiconducting material 104. In further exemplary embodiments, mold 100 may be moved in a direction parallel to surface 108 of molten semiconducting material 104 as mold 100 is immersed in a direction perpendicular to surface 108 of molten semiconducting material 104. Such parallel motion may include translation of the mold at a set or variable rate, or vibration of the mold at a set or variable frequency. One skilled in the art would also recognize that the local immersion angle, which is the immersion angle at any finite location at the point P of first contact, may also vary due to the surface properties (such as, for example, porosity or height variations) and the wetting angle between the melt and the material comprising the mold.

In a further exemplary embodiment, external surface 102 of mold 100 may be substantially perpendicular to the surface 108 of the molten semiconducting material 104, i.e., the immersion angle is approximately 90°. In a further embodiment, the external surface 102 of mold 100 need not be perpendicular to the surface 108 of molten semiconducting material 104. By way of example, the external surface 102 of mold 100 may be immersed in the molten semiconducting material 104 at an immersion angle ranging from 0° to 180°, such as from 0° to 90°, from 0° to 30°, from 60° to 90°, or at an immersion angle of 45°.

In at least one embodiment of the invention, mold 100 may be immersed in the molten semiconducting material 104 at least two times. According to at least one embodiment, mold 100 is immersed in the molten semiconducting material 104 more than two times. In at least one embodiment of the invention, immersion of the mold may be accomplished using any suitable technique, and may be accomplished by immersing the mold from above the molten semiconducting material or from the side or bottom of the molten semiconducting material.

In at least one embodiment, mold 100 may be immersed in the molten semiconducting material 104 for a set or predetermined time (i.e., the immersion time) to allow a layer of the semiconducting material to sufficiently solidify over a surface 102 of mold 100. In at least one embodiment, the semiconducting material is sufficiently solidified when enough semiconducting material has solidified that the mold can be withdrawn from the molten semiconducting material and the layer of semiconducting material will be withdrawn with the mold. According to at least one embodiment, the immersion time is chosen based on the desired thickness of the produced article of semiconducting material. In at least one embodiment, at least one heating element 109, such as resistive heating elements or inductive heating elements, may be used to heat the crucible 106 and maintain the molten semiconducting material 104 at a set or predetermined temperature while mold 100 is immersed. In at least one embodiment, the bulk temperature of the molten semiconducting material 104 may be maintained at approximately temperature, $T_{Melt}$. The semiconducting material 104 may be melted and maintained in molten form by any desired method, and the selection of the heating method would be within the skill of one in the art and may be based on the conditions and environment where the method is performed. In at least one embodiment, the method may be performed in a reducing environment and may use radio frequency (RF) induction heating to maintain the temperature of the molten semiconducting material. RF induction heating may provide a cleaner environment by reducing the possibility of the presence of foreign matter in the melt.

Induction heating may also provide the heat flux needed to maintain the desired bulk molten material temperature as the material near the surface of mold 100 extracts heat rapidly.

According to at least one embodiment, mold 100 may be held essentially motionless in the plane parallel to the surface 108 of molten semiconducting material 104 as it is immersed in a direction perpendicular to surface 108 of molten semiconducting material 104. In other embodiments, mold 100 may be moved in the plane parallel to the surface 108 of molten semiconducting material 104, for example rotated or vibrated at any appropriate frequency, when it is immersed in a direction perpendicular to the surface 108 of molten semiconducting material 104. A layer of semiconducting material 110 may form on the surface 102 of mold 100. After immersion, mold 100 with a layer of semiconducting material 110 may be withdrawn from the vessel 106. In at least one embodiment, mold 100 with a solid layer of semiconducting material 110 may be cooled after it is removed from vessel 106, either actively such as by convective cooling, or by allowing the temperature of the layer of semiconducting material 110 to come to room temperature. After the coated mold 100 is removed from vessel 106 and sufficiently cooled, the solid layer of semiconducting material 110 may be removed or separated from mold 100 by any method known to those of skill in the art. In at least one embodiment, the solid layer of semiconducting material 110 may be separated from mold 100 by differential expansion and/or mechanical assistance.

In at least one embodiment, the semiconducting material is chosen from silicon, germanium, gallium arsenide, tin, as well as compounds, alloys and mixtures thereof. According to various embodiments of the invention, the semiconducting material may be pure or doped. In at least one embodiment, the semiconducting material comprises at least one dopant chosen from boron (B), phosphorous (P), or aluminum (Al). In at least one embodiment, the at least one dopant is present in the part per million (ppm) range. The amount of dopant present in the molten semiconducting material may be based on the desired dopant concentration in the formed article of semiconducting material and may depend on the final use of the article, such as, for example, in a photovoltaic cell. According to at least one embodiment, an article of semiconducting material produced by the methods disclosed herein may comprise a dopant dispersed substantially homogeneously throughout the semiconducting material (e.g., without substantial segregation of the dopant within the semiconducting material).

In at least one embodiment, the semiconducting material may comprise semiconducting elements, such as, for example, silicon and germanium. In at least one other embodiment, the semiconducting material comprises a combination or alloy of elements of compounds. For example, the semiconducting material may be chosen from gallium arsenide (GaAs), aluminum nitride (AlN), and indium phosphide (InP).

In at least one embodiment, a number of process parameters may be varied, including but not limited to: (1) the composition, density, heat capacity, thermal conductivity, thermal diffusivity, and thickness of the mold 100, (2) the starting temperature of mold, $T_0$, and the bulk temperature of the molten semiconducting material, $T_{Melt}$, (3) the rate which mold 100 is initially immersed into the molten material 104, (4) the length of time at which mold 100 is immersed a first time in the molten material 104, (5) the rate at which mold 100 is removed from the molten semiconducting material 104, (6) the time mold 100 is allowed to cool after the first immersion, (7) the rate at which mold 100 is immersed into the molten material 104 after reaching the predetermined amount of undercooling, (8) the rate at which mold 100 having the layer of semiconducting material 110 is removed from the molten material 104, and (9) the cooling rate of the solidified semiconducting material 110. In at least one embodiment, the temperature of molten semiconducting material, $T_{Melt}$, and the amount of time for undercooling mold 100 are the only parameters that govern the temperature of mold 100 (i.e., the temperature of the mold is not directly controlled by a heating or cooling device). The temperature of the molten semiconducting material, $T_{Melt}$, may alter the temperature of mold 100 through radiation, convection, or conduction. Radiative heating of mold 100 may occur, for example, when mold 100 is above molten semiconducting material 104. Mold 100 may be convectively heated by molten semiconducting material 104 when fumes above molten semiconducting material 104 pass over the surface of mold 100 or during immersion of mold 100 in the molten semiconducting material 104. Heating of mold 100 by conduction may occur, for example, while mold 100 is immersed in molten semiconducting material 104.

In at least one embodiment, mold 100 is made of a material that is compatible with the molten semiconducting material 104. For example, mold 100 may be made of a material such that when mold 100 is exposed to the molten material 104, the principle material of mold 100 does not react with the molten material 104 in a manner that interferes with the methods disclosed herein, such as, for example, by forming a low-melting compound or solid solution. As a further example, mold 100 may not melt or soften when mold 100 is heated via contact with the molten material 104. In at least one embodiment, mold 100 may not become too fluid to support the solid layer 110 or separate from the solid layer 110 when mold 100 is heated via contact with the molten material 104. In at least one embodiment, mold 100 may be made of a material such that when mold 100 is heated via contact with the molten material 104, mold 100 may not check, fracture, and/or explode due to either large thermal stresses generated from uneven, rapid thermal expansion, or from trapped gases. In at least one embodiment, mold 100 may be made of a material that may not deleteriously contaminate either the solidified layer 110 being formed on the mold or the molten material 104 residuum via breakage, spallation, dusting, and/or diffusion of vapor or liquid phases of solid components or evolved gases. According to at least one embodiment, mold 100 may comprise a material chosen from vitreous silica, fused silica, porous silica, graphite, silicon nitride, silicon carbide, and combinations thereof. In at least one embodiment of the invention, mold 100 may comprise vitreous silica.

Figure 6:
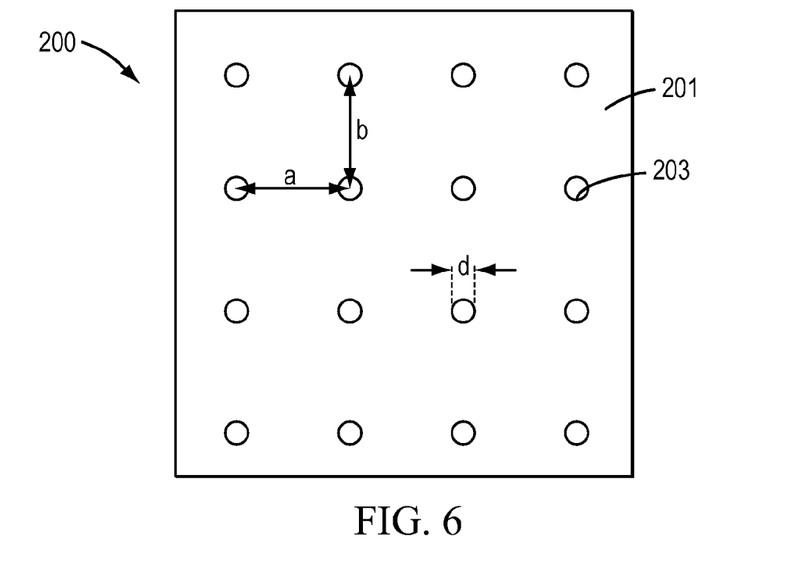
FIG. 6 is a schematic representation of a templated mold.

In at least one embodiment of the invention, the mold may be a templated mold. FIG. 6 shows a schematic illustration of a templated mold 200 according to an embodiment of the invention. Templated mold 200 may have a primary substrate 201 and discrete locations 203 of at least one secondary material that has lower contact angle with molten semiconductor material than the contact angle between molten semiconductor and the principle substrate 201. Discrete locations 203 may have a low contact angle with the semiconducting material and may be more likely to be the site of nucleation than the principle substrate 201, which may have a high contact angle with the molten semiconducting material.

In at least one embodiment of the invention, principle substrate 201 may comprise fused silica, which has a contact angle of about 92°. Other materials that may comprise principle substrate 201 include porous silica, silicon nitride, silicon carbide, graphite, alumina, aluminum nitride, boron nitride, $LaB_6$, zirconia, and yttria.

In at least one embodiment of the invention, discrete locations 203 of a low contact angle material may comprise silicon carbide, which has a contact angle of about 38°. Other materials that may comprise the discrete locations 203 of low contact angle may be chosen from porous silica, silicon nitride, alumina, aluminum nitride, boron nitride, $LaB_6$, zirconia, and yttria. The discrete locations 203 of low contact angle material may have any shape, including, for example, circles, squares, dots, islands, triangles, lines, random shapes, etc. In the exemplary templated mold shown in FIG. 6, discrete locations 203 of lower contact angle material are circular (diameter, d) and spaced at a distances a, b from neighboring discrete locations 203. In at least one embodiment, the contact angle of the lower contact angle material may be at least 10° less than the contact angle of the higher contact angle material. For example, the lower contact angle material may have a contact angle at least 40° less than the contact angle of the higher contact angle material.

In at least one embodiment of the invention, principle substrate 201 may comprise fused silica and discrete locations 203 of lower contact angle material may comprise silicon carbide. As can be seen from the data in FIG. 7, nucleation occurs on silicon carbide at a lower amount of undercooling than on fused silica. In other words, at the same undercooling values, the nucleation rate on silicon carbide is much higher than that on fused silica. In at least one embodiment, the amount of undercooling may be chosen such that nucleation occurs substantially on the discrete locations 203 rather than on principle substrate 201. According to at least one embodiment, the amount of undercooling may range from 1 K to 500 K, such as from 10 K to 300 K, or from 50 K to 200 K. According to at least one embodiment, the amount of undercooling may be chosen such the nucleation rate on the lower contact angle material is at least two times the nucleation rate of the higher contact angle material. For example, the nucleation rate on the lower contact angle material may be ten times or one hundred times greater than the nucleation rate of the higher contact angle material. One skilled in the art would recognize that the amount of undercooling may be chosen based on the materials comprising the high contact angle material and the low contact angle material and the nucleation rates associated with each material.

Mold 100 may be in any form suitable for use in the disclosed methods. For example, in at least one embodiment, mold 100 may be in the form of a monolith or in the form of a laminated structure such as a laminated monolith. Mold 100 may comprise a porous or non-porous body, optionally with at least one porous or non-porous coating. In at least one embodiment, mold 100 may also comprise a uniform or non-uniform composition, uniform or non-uniform porosity, or other uniform or non-uniform structural characteristic throughout the mold body. According to at least one embodiment, mold 100 may also be in any shape suitable for use in the disclosed method. For example, mold 100 may comprise at least one flat surface (e.g., having a rectangular shape) or one or more curved surfaces, for example one or more convex or concave surfaces. For example, the convex or concave surfaces may be used to create an article in the shape of a lens or a tube.

According to at least one embodiment, the rate at which the mold is immersed into the molten material may range from 1 cm/s to 50 cm/s, such as, for example, from 3 cm/s to 10 cm/s. One skilled in the art would recognize that the immersion rate may vary depending on various parameters, such as, for example, the semiconducting material composition (including optional dopants), the size/shape of the mold, and the surface texture of the mold.

The withdrawal rate of the mold from the molten material may affect the smoothness of the surface, thickness or other features of the solid article formed. When the mold is withdrawn from the molten semiconducting material, a layer of molten semiconducting material may wet the surface of the solid layer of semiconducting material on the mold, which may add thickness to the solid layer of semiconducting material and/or may change the surface structure of the solid layer of semiconducting material. In at least one embodiment, solid articles having smooth surfaces may be made using a relatively slow withdrawal rate of the mold from the molten material, such as, for example, from 2 cm/s to 5 cm/s, such as, for example, 5 cm/s. When the mold is pulled out quickly, small local variations in heat removal may manifest as isolated solidification events that trap extra liquid within them, forming puddles and bumps. As these puddles and bumps rapidly solidify, they may form blobs and faceted peaks, sometimes several millimeters tall and one or more centimeters wide. It is believed that slower withdrawal rates may confine the wetted area to the liquid-solid-gas interface and may put a continuous secondary smooth layer on the surface of the solid layer. Furthermore, quickly moving the mold may induce flow patterns and even turbulence in the melt. The coupling between flow motion and heat transfer may cause pattern formation on the solidified surface of the article. In at least one embodiment, an article of semiconducting material may be made by withdrawing the mold at a rate such that a secondary smooth layer is formed on the surface of the solid semiconducting material layer.

The thickness of the secondary layer (i.e., drag layer) can be affected by both how much liquid is dragged and how much of the dragged liquid is solidified. Generally, secondary liquid layer thickness increases with pulling velocity while the solidified layer thickness decreases with pulling velocity. By way of example, if heat transfer is limiting the thickness of the solidified layer, increasing the pulling velocity will decrease the solidified layer thickness due to liquid dragging. In contrast, if the dragged liquid is limited, increasing the pulling velocity will increase the solidified layer thickness due to liquid dragging.

A person skilled in the art would recognize that the immersion rate, immersion time, and withdrawal rate all affect the produced article and that these parameters may be chosen based on the desired article, the material/shape/texture/size of the mold, the starting temperature of the mold, the temperature of the molten semiconducting material, and the properties of the semiconducting material.

Returning again to FIG. 1, in at least one embodiment of the invention, vessel 106, which holds the molten semiconducting material 104, may not react with the molten material 104 and/or may not contaminate the molten material 104, as described above for mold 100. In at least one embodiment, vessel 106 may be made from a material chosen from vitreous silica, graphite, silicon nitride, and silicon carbide. In at least one embodiment, vessel 106 is made of vitreous silica.

Without wishing to be limited by theory, it is believed that in at least certain embodiments, the use of vitreous silica for the mold 104 and/or vessel 106 may lead to oxygen contamination of the semiconducting material. Thus, in various embodiments, oxygen contamination may be mitigated or substantially mitigated by melting the semiconducting material and casting the article in a low-oxygen environment, such as, for example, a dry mixture of hydrogen (<1 ppm of water) and an inert gas such as argon, krypton or xenon. In at least one exemplary embodiment, the atmosphere is chosen from an Ar/1.0 wt % $H_2$ mixture or Ar/2.5 wt % $H_2$ mixture.

In at least one embodiment, mold 100 may have an external surface 102 which is flat. In at least one embodiment, mold 100 may have an external surface 102 with characteristics to form articles with a broad range of shapes, curvatures, and/or textures. As would be understood by one skilled in the art, any other surface texture/pattern desired in the cast article may be incorporated in the external surface 102 of mold 100.

In at least one embodiment, the disclosed method may be used to make a sheet or film of semiconducting material, such as, for example, a silicon sheet, having a size, thickness, and grain structure within the range of usefulness for photovoltaic applications, for example, size up to approximately 156 mm×156 mm, thickness in a range of 100-400 micrometers, and a substantial number of grains larger than 1 mm. According to at least one embodiment, at least about 60% of the grains may be larger than 1 mm. In a further embodiment, at least about 80% or at least about 90% of the grains may be larger than 1 mm. In at least one embodiment, the grains are two to three times greater in size in their narrowest lateral direction than they are thick.

In at least one embodiment, the disclosed method yields an article of semiconducting material at an improved rate and/or a reduction in wasted material. For example, the exocasting processes described herein can be performed with essentially no waste of semiconducting material, since all the melted material can be cast into a useful article. Any broken pieces or other unused material can be remelted and cast again. In at least one embodiment, immersion cycle times of less than 5 seconds are used to form sheets 7 cm in length (independent of width), which translates to a process speed of a few centimeters per second.

Unless otherwise indicated, all numbers used in the specification and claims are to be understood as being modified in all instances by the term "about," whether or not so stated. It should also be understood that the precise numerical values used in the specification and claims form additional embodiments of the invention. Efforts have been made to ensure the accuracy of the numerical values disclosed herein. Any measured numerical value, however, can inherently contain certain errors resulting from the standard deviation found in its respective measuring technique.

It is noted that, as used in this specification and the appended claims, the singular forms "a," "an," and "the," include plural referents unless expressly and unequivocally limited to one referent, and vice versa. Thus, by way of example only, reference to "a heat source" can refer to one or more heat sources, and reference to "a semiconducting material" can refer to one or more semiconducting materials. As used herein, the term "include" and its grammatical variants are intended to be non-limiting, such that recitation of items in a list is not to the exclusion of other like items that can be substituted or added to the listed items.

It will be apparent to those skilled in the art that various modifications and variation can be made to the programs and methods of the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

We claim:

1. A method of making an unsupported article of a semiconducting material, comprising:
   providing a mold at a temperature $T_0$;
   providing a molten semiconducting material at a bulk temperature $T_{Melt}$, wherein $T_{Melt} \geq T_0$;
   immersing the mold in the molten semiconducting material at least once for a first period of time sufficient to form a solid layer of the semiconducting material over an external surface of the mold and for the formed solid layer of semiconducting material to completely remelt;
   withdrawing the mold from the molten semiconducting material;
   holding the mold above the molten semiconducting material for a period of time sufficient to undercool the mold a predetermined amount;
   immersing the mold in the molten semiconducting material for a second period of time sufficient to form a solid layer of the semiconducting material over the external surface of the mold;
   withdrawing the mold with the solid layer of semiconducting material on the external surface of the mold; and
   separating the solid layer of semiconducting material from the mold to form the unsupported article of the semiconducting material.

2. The method of claim 1, wherein the semiconducting material is chosen from silicon, alloys and compounds of silicon, germanium, alloys and compounds of germanium, gallium arsenide, alloys and compounds of gallium arsenide, tin, alloys and compounds of tin, and mixtures thereof.

3. The method of claim 1, wherein the semiconducting material is chosen from silicon, silicon alloys, and silicon compounds.

4. The method of claim 3, wherein $T_{Melt}$ ranges from about 1414° C. to about 1550° C.

5. The method of claim 1, wherein the first period of time of mold immersion is equal to $t_{remelt}$, wherein:

$$t_{remelt} = \frac{d_{Mold}^2}{8\alpha_{Mold}} \ln(1-f) + \Delta^2 \pi \alpha_{Melt} \left( \frac{\rho_{Melt}\lambda}{2K_{Melt}(T_M - T_{Melt})} \right)^2 \text{ and}$$

$$\Delta = \frac{1}{2}\left[ \frac{\rho_{Mold}Cp_{Mold}d_{Mold}(T_M - T_0)}{\rho_{Melt}\lambda + \rho_{Melt}Cp_{Melt}(T_{Melt} - T_M)} \right],$$

wherein $d_{Mold}$ is a thickness of the mold, $\alpha_{Mold}$ is a thermal diffusivity of the mold, $\rho T_{Mold}$ is a density of the mold, $Cp_{Mold}$ is a heat capacity of the mold, $\Delta$ is a maximum thickness of semiconducting material formed on the external surface of the mold, $\alpha T_{Melt}$ is a thermal diffusivity of the molten semiconducting material, $Cp_{Melt}$ is a heat capacity of the molten semiconducting material, $\rho T_{Melt}$ is a density of the molten semiconducting material, $K_{Melt}$ is thermal conductivity of the molten semiconductor material, $\lambda$ is latent heat, $T_M$ is a melting temperature of the semiconducting material, $T_0$ is the temperature at which the mold is provided, $T_{Melt}$ is the bulk temperature of the molten semiconducting material, and $0 < f < 1$.

6. The method of claim 1, wherein the mold is undercooled by an amount ranging from about 1 K to about 500 K.

7. The method of claim 1, wherein the mold is undercooled for a period of time, t, wherein:

$$t = \left( \frac{d_{Mold}\rho_{Mold}Cp_{Mold}}{6\varepsilon_{Mold}\sigma} \right)\left( \frac{1}{T_{Mold}^3} - \frac{1}{T_{Melt}^3} \right)$$

wherein $T_{Mold}$ is the temperature of the mold for the predetermined amount of undercooling, $T_{Melt}$ is the bulk temperature of the melt, $\varepsilon_{Mold}$ is an emissivity of the mold, $\sigma$ is the Stefan-Boltzmann constant, $\rho_{Mold}$ is a density of the mold, $Cp_{Mold}$ is a heat capacity of the mold, $d_{Mold}$ is a thickness of the mold, and t is the time to hold the mold above the molten semiconducting material.

8. The method of claim 1, wherein the mold is made of a material chosen from vitreous silica, porous silica, fused silica, silicon nitride, silicon carbide, graphite, alumina, aluminum nitride, boron nitride, LaB$_6$, zirconia, and yttria.

9. The method of claim 1, wherein the mold is a templated mold comprising at least two materials having different contact angles with the molten semiconducting material.

10. The method of claim 9, wherein the templated mold comprises fused silica and silicon carbide.

11. The method of claim 9, wherein the at least two materials have contact angles that differ by at least 10°.

12. The method of claim 1, wherein an atmosphere above the molten semiconducting material comprises argon and hydrogen.

13. A method of making an unsupported article of a semiconducting material, comprising:
providing a mold at a temperature T$_0$, wherein the mold comprises a principle substrate and discrete locations comprising a material having a contact angle with the molten semiconducting material lower than a contact angle between the molten semiconducting material and the principle substrate;
providing a molten semiconducting material at a bulk temperature T$_{Melt}$, wherein T$_{Melt}$≧T$_0$;
immersing the mold in the molten semiconducting material at least once for a first period of time sufficient to form a solid layer of the semiconducting material over an external surface of the mold and for the formed solid layer of semiconducting material to completely remelt;
withdrawing the mold from the molten semiconducting material;
holding the mold above the molten semiconducting material for a period of time sufficient to undercool the mold a predetermined amount;
immersing the mold in the molten semiconducting material for a second period of time sufficient to form a solid layer of the semiconducting material over the external surface of the mold;
withdrawing the mold with the solid layer of semiconducting material on the external surface of the mold; and
separating the solid layer of semiconducting material from the mold to form the unsupported article of the semiconducting material.

14. The method of claim 13, wherein the principle substrate is chosen from vitreous silica, fused silica, porous silica, silicon nitride, silicon carbide, graphite, alumina, aluminum nitride, boron nitride, LaB$_6$, zirconia, and yttria.

15. The method of claim 13, wherein the discrete locations of lower contact angle are chosen from fused silica, porous silica, silicon nitride, silicon carbide, alumina, aluminum nitride, boron nitride, LaB$_6$, zirconia, and yttria.

16. The method of claim 13, wherein the principle substrate has a contact angle at least 10° greater than the contact angle of the discrete locations of lower contact angle material.

17. The method of claim 13, wherein the mold is undercooled by an amount ranging from about 1 K to about 500 K.

18. The method of claim 13, wherein the mold is undercooled for a period of time, t, wherein:

$$t = \left(\frac{d_{Mold}\rho_{Mold}Cp_{Mold}}{6\varepsilon_{Mold}\sigma}\right)\left(\frac{1}{T_{Mold}^3} - \frac{1}{T_{Melt}^3}\right)$$

wherein T$_{Mold}$ is the temperature of the mold for the predetermined amount of undercooling, T$_{Melt}$ is the bulk temperature of the melt, $\varepsilon_{Mold}$ is an emissivity of the mold, σ is the Stefan-Boltzmann constant, $\rho_{Mold}$ is a density of the mold, $Cp_{Mold}$ is a heat capacity of the mold, $d_{Mold}$ is a thickness of the mold, and t is the time to hold the mold above the molten semiconducting material.

19. The method of claim 13, wherein the first period of time of mold immersion is equal to $t_{remelt}$, wherein:

$$t_{remelt} = -\frac{d_{Mold}^2}{8\alpha_{Mold}}\ln(1-f) + \Delta^2\pi\alpha_{Melt}\left(\frac{\rho_{Melt}L}{2K_{Melt}(T_M - T_{Melt})}\right)^2 \text{ and}$$

$$\Delta = \frac{1}{2}\left[\frac{\rho_{Mold}Cp_{Mold}d_{Mold}(T_M - T_0)}{\rho_{Melt}L + \rho_{Melt}Cp_{Melt}(T_{Melt} - T_M)}\right],$$

wherein $d_{Mold}$ is a thickness of the mold, $\alpha_{Mold}$ is a thermal diffusivity of the mold, $\rho_{Mold}$ is a density of the mold, $Cp_{Mold}$ is a heat capacity of the mold, Δ is a maximum thickness of semiconducting material formed on the external surface of the mold, $\alpha_{Melt}$ is a thermal diffusivity of the molten semiconducting material, $Cp_{Melt}$ is a heat capacity of the molten semiconducting material, $\rho_{Melt}$ is a density of the molten semiconducting material, $K_{Melt}$ is thermal conductivity of the molten semiconductor material, λ is latent heat, T$_M$ is a melting temperature of the semiconducting material, T$_0$ is the temperature at which the mold is provided, T$_{Melt}$ is the bulk temperature of the molten semiconducting material, and 0<f<1.

20. The method of claim 13, wherein an atmosphere above the molten semiconducting material comprises argon and hydrogen.

21. The method of claim 13, wherein the semiconducting material is chosen from silicon, alloys and compounds of silicon, germanium, alloys and compounds of germanium, gallium arsenide, alloys and compounds of gallium arsenide, tin, alloys and compounds of tin, and mixtures thereof.

22. The method of claim 21, wherein the semiconducting material is chosen from silicon, silicon alloys, and silicon compounds.

23. The method of claim 22, wherein T$_{Melt}$ ranges from about 1414° to about 1550° C.

* * * * *